(12) United States Patent
Lim et al.

(10) Patent No.: US 8,461,693 B2
(45) Date of Patent: Jun. 11, 2013

(54) SUBSTRATE ARRANGEMENT

(75) Inventors: Hock Peng Lim, Singapore (SG); Meng Kiang Lim, Singapore (SG)

(73) Assignee: Siemens Medical Instruments Pte. Ltd., Singapore (SG)

( * ) Notice: Subject to any disclaimer, the term of this patent is extended or adjusted under 35 U.S.C. 154(b) by 103 days.

(21) Appl. No.: 13/061,261

(22) PCT Filed: Aug. 26, 2008

(86) PCT No.: PCT/SG2008/000314
§ 371 (c)(1),
(2), (4) Date: Apr. 29, 2011

(87) PCT Pub. No.: WO2010/024777
PCT Pub. Date: Mar. 4, 2010

(65) Prior Publication Data
US 2011/0233783 A1    Sep. 29, 2011

(51) Int. Cl.
*H01L 23/52*  (2006.01)
*H01L 23/48*  (2006.01)
*H01L 29/40*  (2006.01)

(52) U.S. Cl.
USPC .......... 257/777; 257/E21.614; 257/685; 257/686; 438/108; 438/109

(58) Field of Classification Search
CPC .............. H01L 27/06; H01L 23/532
USPC .......... 257/E23.065, E23.157, E27.027, 257/506, 688, 691, 734, 738, 762, E21.614, 257/685, 686, 777–780; 438/106–111, 118, 438/614, 617
See application file for complete search history.

(56) References Cited

U.S. PATENT DOCUMENTS

| | | | |
|---|---|---|---|
| 5,222,014 A * | 6/1993 | Lin | 361/792 |
| 5,436,744 A * | 7/1995 | Arledge et al. | 349/150 |
| 6,091,145 A * | 7/2000 | Clayton | 257/724 |
| 6,225,688 B1 * | 5/2001 | Kim et al. | 257/686 |
| 6,674,869 B2 | 1/2004 | Paczkowski | |
| 6,765,288 B2 * | 7/2004 | Damberg | 257/698 |
| 6,977,441 B2 * | 12/2005 | Hashimoto | 257/777 |
| 7,145,249 B2 * | 12/2006 | Chao et al. | 257/778 |
| 7,154,175 B2 * | 12/2006 | Shrivastava et al. | 257/723 |
| 7,167,373 B1 | 1/2007 | Hoang et al. | |
| 7,288,433 B2 * | 10/2007 | Haba et al. | 438/107 |
| 7,390,700 B2 * | 6/2008 | Gerber et al. | 438/108 |
| 7,397,115 B2 * | 7/2008 | Lee | 257/678 |
| 2004/0238936 A1 | 12/2004 | Rumer et al. | |
| 2005/0212112 A1 * | 9/2005 | Chao et al. | 257/688 |
| 2006/0077644 A1 * | 4/2006 | Nickerson et al. | 361/767 |
| 2006/0223227 A1 * | 10/2006 | Kubota et al. | 438/106 |
| 2006/0278962 A1 | 12/2006 | Gibson | |
| 2007/0096318 A1 * | 5/2007 | Kawashiro | 257/738 |

* cited by examiner

*Primary Examiner* — Chris Chu
(74) *Attorney, Agent, or Firm* — Laurence A. Greenberg; Werner H. Stemer; Ralph E. Locher

(57) ABSTRACT

In an embodiment, a substrate arrangement is provided. The substrate arrangement may include a semiconductor substrate including a first contact portion and a second contact portion on a first surface of the semiconductor substrate, wherein the semiconductor substrate is arranged such that the first contact portion and the second contact portion face each other. The substrate arrangement may further include an electrical connector configured to connect the first contact portion and the second contact portion.

40 Claims, 4 Drawing Sheets

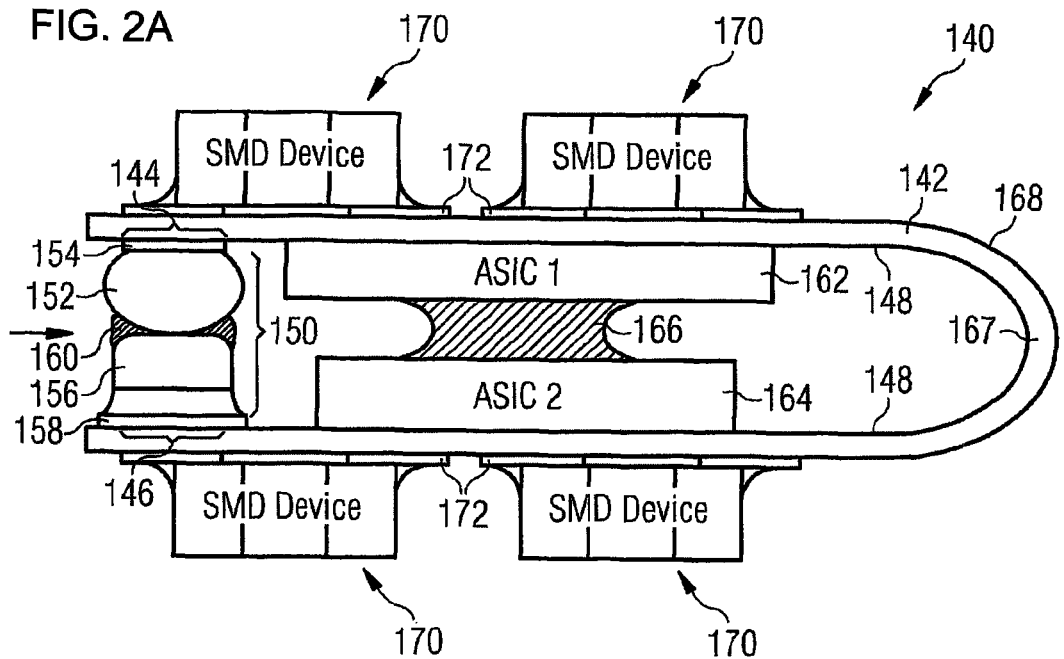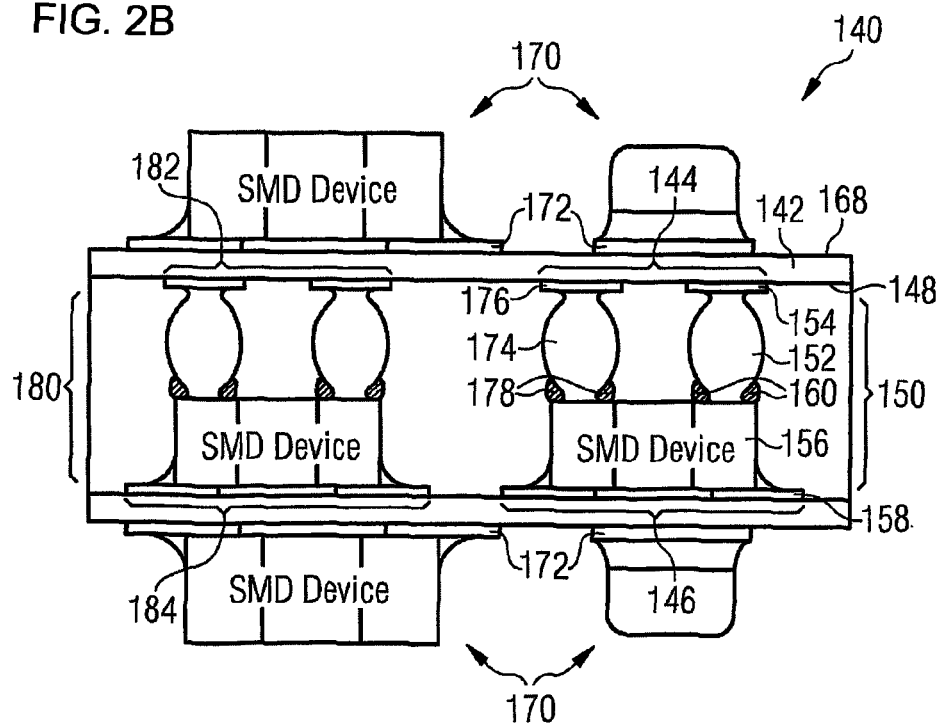

SUBSTRATE ARRANGEMENT

BACKGROUND OF THE INVENTION

Field of the Invention

Generally, a PCB module with an integrated circuit mounted on the PCB is encapsulated by molding using an epoxy molding compound (EMC) to reduce or prevent damage to the integrated circuit from external impacts. That is, in a PCB module having, for example, two integrated circuits mounted on respective sides of a same surface of a single PCB, the sides of the PCB may be encapsulated by a molding formed from an EMC to reduce or prevent damage from external impacts.

BRIEF SUMMARY OF THE INVENTION

In various embodiments of the invention, a substrate arrangement is provided, which is more convenient to fabricate and cost-effective.

An embodiment of the invention provides a substrate arrangement. The substrate arrangement may include a semiconductor substrate including a first contact portion and a second contact portion on a first surface of the semiconductor substrate, wherein the semiconductor substrate is arranged such that the first contact portion and the second contact portion face each other. The substrate arrangement further includes an electrical connector configured to connect the first contact portion and the second contact portion.

The semiconductor substrate may include a PCB, for example a flexible PCB. The semiconductor substrate may include any flexible material with a bend portion or any material which may be configured to a desired shape.

In an embodiment, the electrical connector includes a first surface mount device. The first surface mount device may be selected from a group consisting of a capacitor, a resistor, an inductor, a ferrite bead, a Wafer Level Chip Scale Packaging (WL-CSP), a Ball Grid Array (BGA) and a crystal.

In an embodiment, the electrical connector includes a first conductive portion wherein the first conductive portion is positioned to be in contact with the first contact portion.

In an embodiment, the electrical connector further includes a second conductive portion wherein the second conductive portion is positioned to be in contact with the second contact portion.

In an embodiment, the first conductive portion is positioned to be in electrical connection with the second conductive portion.

In an embodiment, the electrical connector further includes a third conductive portion, positioned at or around an interface between the first conductive portion and the second conductive portion.

In an embodiment, the electrical connector further includes a second surface mount device wherein the second surface mount device is positioned to be in contact with the second contact portion. The second surface mount device may be selected from a group consisting of a capacitor, a resistor, an inductor, a ferrite bead, a WL-CSP, a BGA and a crystal.

In an embodiment, the first conductive portion is positioned to be in electrical connection with the second surface mount device.

In an embodiment, the electrical connector further includes a fourth conductive portion, positioned at or around an interface between the first conductive portion and the second surface mount device.

In an embodiment, the electrical connector may include a single conductive portion, two or more conductive portions, a single surface mount device, two or more surface mount devices or a combination of conductive portion(s) and surface mount device(s) depending on requirements.

In an embodiment, at least one conductive portion of the conductive portions includes a material or consists of a material selected from the group consisting of a solder material and a copper material.

In an embodiment, the first conductive portion, the second conductive portion, the third conductive portion and the fourth conductive portion are made of the same material.

In an embodiment, the at least one conductive portion of the conductive portions may be of any suitable shape and size depending on requirements. The at least one conductive portion of the conductive portions may also be formed using any suitable process.

In an embodiment, the substrate arrangement further includes a first metallic interconnect disposed between the first contact portion and the electrical connector. The first metallic interconnect may include a stack arrangement. The first metallic interconnect may include a first metallic layer, a second metallic layer disposed above the first metallic layer and a third metallic layer disposed above the second metallic layer. The first metallic layer may be in contact with the first contact portion and the third metallic layer may be in contact with the electrical connector. The first metallic layer may include a copper material, the second metallic layer may include a nickel material and the third metallic layer may include a gold material, for example.

In an embodiment, the substrate arrangement may further include a second metallic interconnect disposed between the second contact portion and the electrical connector. The second metallic interconnect may include a stack arrangement. The second metallic interconnect may include a fourth metallic layer, a fifth metallic layer disposed above the fourth metallic layer and a sixth metallic layer disposed above the fifth metallic layer. The fourth metallic layer is in contact with the second contact portion and the sixth metallic layer is in contact with the electrical connector. The fourth metallic layer may be of the same material as the first metallic layer and may include a copper material. The fifth metallic layer may be of the same material as the second metallic layer and may include a nickel material. The sixth metallic layer may be of the same material as the third metallic layer and may include a gold material.

In an embodiment, the first metallic interconnect and the second metallic interconnect may be formed by an Electroless Nickel Immersion Gold (ENIG) process, an Organic Solderabilty Preservatives (OSP) process, and any other suitable finishing processes.

In an embodiment, the substrate arrangement may further include a first integrated circuit disposed on the first surface of the semiconductor substrate. The substrate arrangement may further include a second integrated circuit disposed on the first surface of the semiconductor substrate. The first integrated circuit may be positioned adjacent to the electrical connector on the first surface of the semiconductor substrate. The second integrated circuit may be positioned adjacent to the electrical connector on the first surface on the semiconductor substrate. The first integrated circuit and the second integrated circuit may be arranged such that the first integrated circuit and the second integrated circuit face each other. The first integrated circuit may be electrically connected to the second integrated circuit via the electrical connector.

In an embodiment, the first integrated circuit may be coupled to the second integrated circuit via an interconnecting portion. The interconnecting portion may include a material selected from the group consisting of an adhesive, a tape, an epoxy material. The interconnecting portion may include a material that may help to provide Electromagnetic Compatibility (EMC) shielding between the first integrated circuit and the second integrated circuit or to prevent noise coupling from the first integrated circuit to the second integrated circuit and vice versa.

In an embodiment, the semiconductor substrate may further include at least one electrically conductive trace or electrically conductive track on the first surface of the semiconductor substrate. The at least one conductive trace or track may include a copper material or any suitable materials. The first integrated circuit may be electrically connected to the second integrated circuit via the at least one conductive trace or track. There may be multiple electrical connections between the first integrated circuit and the second integrated circuit if there are multiple conductive traces or tracks on the first surface of the semiconductor substrate.

In an embodiment, the first integrated circuit may be an application-specific integrated circuit (ASIC) or any other type of hard-wired logic or programmable logic. The second integrated circuit may also be an ASIC or any other type of hard-wired logic or programmable logic. In an embodiment, the first integrated circuit may be a digital circuit and the second integrated circuit may be an analogue circuit and vice versa depending on requirements.

In an embodiment, the semiconductor substrate may further include a second surface positioned opposite to the first surface.

In an embodiment, the substrate arrangement may further include a third surface mount device disposed on the second surface of the semiconductor substrate. The third surface mount device may be selected from a group consisting of a capacitor, a resistor, an inductor, a ferrite bead, a WL-CSP, a BGA and a crystal. The third surface mount device may be the same as the first and second surface mount devices or a different type of surface mount device.

In an embodiment, the substrate arrangement may further include a third metallic interconnect disposed between the second surface and the third surface mount device. The third metallic interconnect may be a stack arrangement similar to the first and second metallic interconnects.

In an embodiment, the substrate arrangement further includes a third integrated circuit disposed on the second surface of the semiconductor substrate. The third integrated circuit may be an ASIC or any other type of hard-wired logic circuit or programmable logic circuit. The third integrated circuit may be the same as the first and second integrated circuits or any other type of hard-wired logic circuit or programmable logic circuit. The third integrated circuit may be positioned adjacent to the third surface mount device on the second surface of the semiconductor substrate.

In an embodiment, the substrate arrangement may be used in a hearing aid, for example in a behind-the-ear (BTE) aid, in the ear (ITE) aid, in the canal (ITC) aid, completely in the canal (CIC) aid, etc.

In an embodiment, the electrical connector may help to hold the first contact portion and the second contact portion on the first surface of the semiconductor substrate together so as achieve a suitable shape for a flexible substrate arrangement. The electrical connector may also help to provide for a further connection path from the first integrated circuit to the second integrated circuit in addition to a connection path along the at least one conductive trace along a bend of the semiconductor substrate.

In an embodiment, an enclosed portion substantially defined by the first surface of the semiconductor substrate and around the respective electrical connector, the first integrated circuit and the second integrated circuit may be filled with a suitable encapsulant for further reinforcement depending on requirements.

In an embodiment, the formation (or reflow process) of the electrical connector may be carried out at substantially the same time as the respective formations of the first and second metallic interconnects.

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

BRIEF DESCRIPTION OF THE SEVERAL VIEWS OF THE DRAWING

FIGS. 2A and 2B show respective front and side views of a substrate arrangement;

DESCRIPTION OF THE INVENTION

Figure 1A:
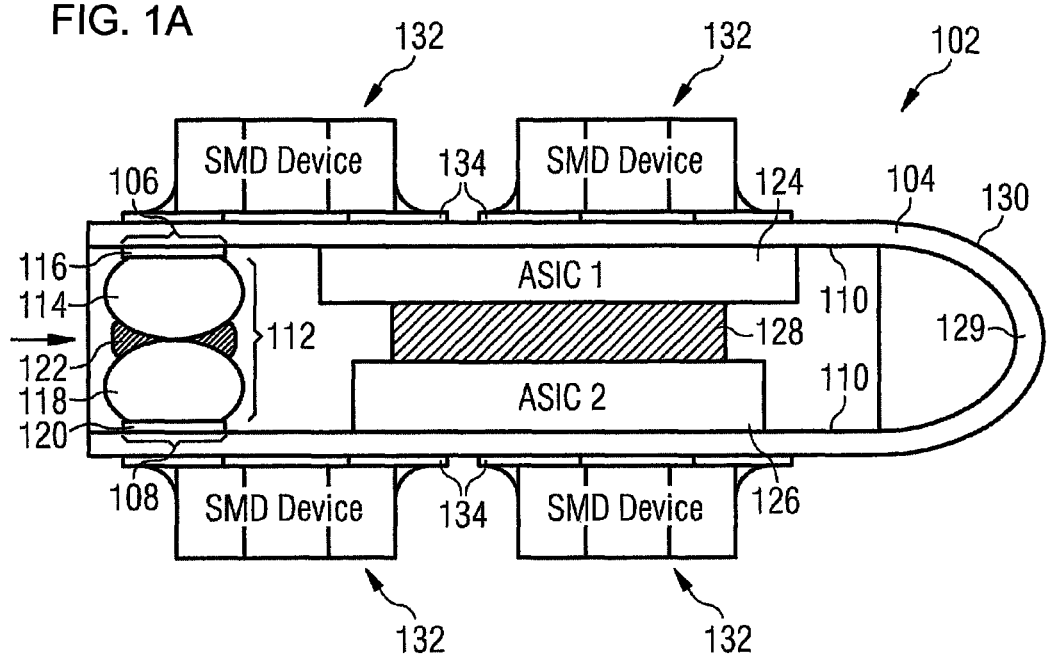
FIGS. 1A and 1B show respective front and side views of a substrate arrangement.
Figure 1B:
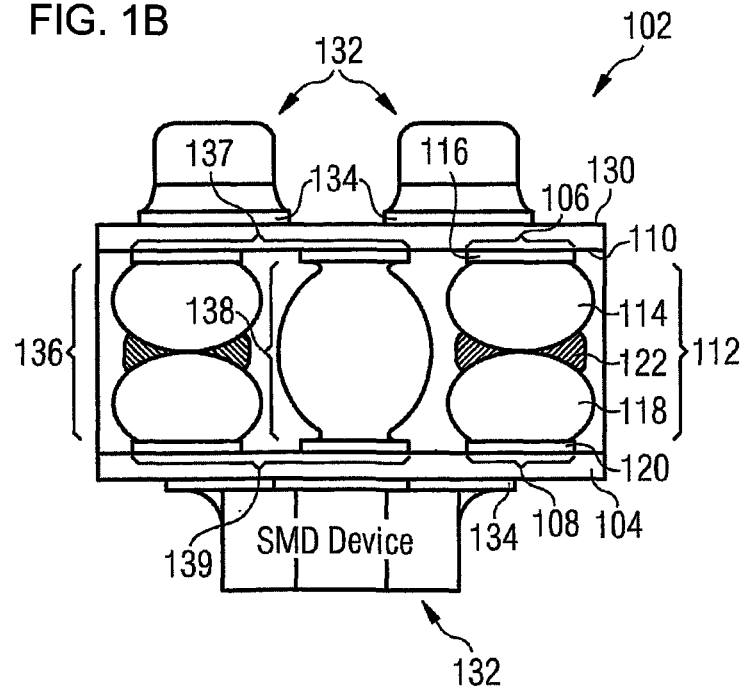

FIG. 1A and FIG. 1B show respective front and side views of a substrate arrangement 102.

As can be seen in FIG. 1A, the substrate arrangement 102 includes a semiconductor substrate 104 including a first contact portion 106 and a second contact portion 108 on a first surface 110 of the semiconductor substrate 104. The semiconductor substrate 104 is arranged such that the first contact portion 106 and the second contact portion 108 face each other. The substrate arrangement 102 further includes an electrical connector 112 configured to connect the first contact portion 106 and the second contact portion 108. The electrical connector 112 includes a first conductive portion 114 and the first conductive portion 114 is positioned to be in contact with the first contact portion 106 via a first metallic interconnect 116. The electrical connector 112 includes a second conductive portion 118 and the second conductive portion 118 is positioned to be in contact with the second contact portion 108 via a second metallic interconnect 120. The first conductive portion 114 is positioned to be in electrical connection with the second conductive portion 118. The electrical connector 112 further includes a third conductive portion 122, positioned at or around an interface between the first conductive portion 114 and the second conductive portion 118.

At least one conductive portion of the first 114, second 118 or third 122 conductive portions include a material selected from the group consisting of a solder material, a copper material. The first conductive portion 114, the second conductive portion 118 and the third conductive portion 122 may be made of the same material.

As mentioned previously, the substrate arrangement 102 may further include the first metallic interconnect 116 disposed between the first contact portion 106 and the electrical connector 112. The first metallic interconnect 116 may include a stack arrangement (not shown), the stack arrangement including a first metallic layer, a second metallic layer disposed above the first metallic layer and a third metallic layer disposed above the second metallic layer. The first metallic layer is in contact with the first contact portion 106 and the third metallic layer is in contact with the electrical connector 112. The first metallic layer may include a copper material, the second metallic layer may include a nickel material and the third metallic layer may include a gold material.

As also mentioned previously, the substrate arrangement 102 may further include the second metallic interconnect 120 disposed between the second contact portion 108 and the electrical connector 112. The second metallic interconnect 120 may include a stack arrangement (not shown), the stack arrangement including a fourth metallic layer, a fifth metallic layer disposed above the fourth metallic layer and a sixth metallic layer disposed above the fifth metallic layer. The fourth metallic layer is in contact with the second contact portion 108 and the sixth metallic layer is in contact with the electrical connector 112. The fourth metallic layer may be of the same material as the first metallic layer and may include a copper material. The fifth metallic layer may be of the same material as the second metallic layer and may include a nickel material. The sixth metallic layer may be of the same material as the third metallic layer and may include a gold material.

The substrate arrangement 102 may further include a first integrated circuit 124 and a second integrated circuit 126 disposed on the first surface 110 of the semiconductor substrate. The first integrated circuit 124 and the second integrated circuit 126 may be application-specific integrated circuits. The first integrated circuit 124 may be positioned adjacent to the first conductive portion 114 on the first surface 110 of the semiconductor substrate 104 and the second integrated circuit 126 may be positioned adjacent to the second conductive portion 118 on the first surface 110 on the semiconductor substrate 104. The first integrated circuit 124 may be electrically connected to the second integrated circuit 126 via at least one copper trace (not shown) on respective portions on the first surface 110 on the semiconductor substrate 104 and the electrical connector 112.

The first integrated circuit 124 and the second integrated circuit 126 are arranged such that the first integrated circuit 124 and the second integrated circuit 126 face each other. The first integrated circuit 124 is coupled to the second integrated circuit 126 via an interconnecting portion 128. The interconnecting portion 128 includes a material selected from the group consisting of an adhesive, a tape, an epoxy material.

The semiconductor substrate 104 may further include at least one conductive trace (not shown) on the first surface 110 of the semiconductor substrate 104. The at least one conductive trace may include a copper material. The first integrated circuit 124 is electrically connected to the second integrated circuit 126 via the at least one conductive trace along the bend 129 of the semiconductor substrate 104.

The semiconductor substrate 104 may further include a second surface 130 positioned opposite to the first surface 110. The substrate arrangement 102 may further include a plurality of surface mount devices 132 (the front view of which is shown) disposed on the second surface 130 of the semiconductor substrate 104. The semiconductor arrangement 102 may further include a plurality of third metallic interconnects 134, each third metallic interconnect 134 disposed between the second surface 130 and each of the plurality of the surface mount devices 132. The third metallic interconnect 134 may include a stack arrangement like the first 116 and second 120 metallic interconnects. Each of the plurality of surface mount devices 132 may be selected from a group consisting of a capacitor, a resistor, an inductor, a ferrite bead, WL-CSP, BGA and a crystal.

FIG. 1B is the side view of the substrate arrangement 102 as seen in the direction of the arrow as shown in FIG. 1A. As can be seen in FIG. 1B, the substrate arrangement 102 includes two further electrical connectors 136, 138 configured to connect the respective opposing contact portions 137, 139 on the first surface 110 of the semiconductor substrate 104. One of the electrical connector 136 may be similar to the electrical connector 112 as shown in the front view in FIG. 1A and the other electrical connector 138 may include a single conductive portion instead of two conductive portions as seen in the electrical connector 112 as shown in the front view in FIG. 1A.

FIG. 2A and FIG. 2B show respective front and side views of a substrate arrangement.

As can be seen in FIG. 2A, the substrate arrangement 140 may include a semiconductor substrate 142 including a first contact portion 144 and a second contact portion 146 on a first surface 148 of the semiconductor substrate 142. The semiconductor substrate 142 may be arranged such that the first contact portion 144 and the second contact portion 146 face each other. The substrate arrangement 140 further includes an electrical connector 150 configured to connect the first contact portion 144 and the second contact portion 146. The electrical connector 150 includes a first conductive portion 152 and the first conductive portion 152 is positioned to be in contact with the first contact portion 144 via a first metallic interconnect 154. The electrical connector 150 includes a first surface mount device 156 (the side view of which is shown) and the first surface mount device 156 is positioned to be in contact with the second contact portion 146 via a second metallic interconnect 158. The first conductive portion 152 is positioned to be in electrical connection with the first surface mount device 156. The electrical connector 150 further includes a second conductive portion 160, positioned at or around an interface between the first conductive portion 152 and the first surface mount device 156. The first surface mount device 156 may be selected from a group consisting of a capacitor, a resistor, an inductor, a ferrite bead, WL-CSP, BGA and a crystal.

At least one conductive portion of the first 152 or second 160 conductive portions includes a material selected from the group consisting of a solder material, a copper material. The first conductive portion 152 and the second conductive portion 160 may be made of the same material.

As mentioned previously, the substrate arrangement 140 further may include the first metallic interconnect 154 disposed between the first contact portion 144 and the electrical connector 150. The first metallic interconnect 154 may include a stack arrangement (not shown), the stack arrangement including a first metallic layer, a second metallic layer disposed above the first metallic layer and a third metallic layer disposed above the second metallic layer. The first metallic layer is in contact with the first contact portion 144 and the third metallic layer is in contact with the electrical connector 150. The first metallic layer may include a copper material, the second metallic layer may include a nickel material and the third metallic layer may include a gold material.

As also mentioned previously, the substrate arrangement 140 may further include the second metallic interconnect 158 disposed between the second contact portion 146 and the electrical connector 150. The second metallic interconnect 158 may include a stack arrangement (not shown), the stack arrangement including a fourth metallic layer, a fifth metallic layer disposed above the fourth metallic layer and a sixth metallic layer disposed above the fifth metallic layer. The fourth metallic layer is in contact with the second contact portion 146 and the sixth metallic layer is in contact with the electrical connector 150. The fourth metallic layer may be of the same material as the first metallic layer and may include a copper material. The fifth metallic layer may be of the same material as the second metallic layer and may include a nickel material. The sixth metallic layer may be of the same material as the third metallic layer and may include a gold material.

The substrate arrangement 140 further includes a first integrated circuit 162 and a second integrated circuit 164 disposed on the first surface 148 of the semiconductor substrate 142. The first integrated circuit 162 and the second integrated circuit 164 may be application-specific integrated circuits or any other type of hard-wired logic circuit or programmable logic circuit. The first integrated circuit 162 may be positioned adjacent to the first conductive portion 152 on the first surface 148 of the semiconductor substrate 142 and the second integrated circuit 164 may be positioned adjacent to the first surface mount device 156 on the first surface 148 on the semiconductor substrate 142. The first integrated circuit 162 may be electrically connected to the second integrated circuit 164 via at least one copper trace (not shown) on respective portions on the first surface 148 on the semiconductor substrate 142 and the electrical connector 150.

The first integrated circuit 162 and the second integrated circuit 164 are arranged such that the first integrated circuit 162 and the second integrated circuit 164 face each other. The first integrated circuit 162 is coupled to the second integrated circuit 164 via an interconnecting portion 166. The interconnecting portion 166 includes a material selected from the group consisting of an adhesive, a tape, an epoxy material.

The semiconductor substrate 142 further includes at least one conductive trace (not shown) on the first surface 148 of the semiconductor substrate 142. The at least one conductive trace may include a copper material. The first integrated circuit 162 is electrically connected to the second integrated circuit 164 via the at least one conductive trace along the bend 167 of the semiconductor substrate 142.

The semiconductor substrate 142 further includes a second surface 168 positioned opposite to the first surface 148. The substrate arrangement 140 further includes a plurality of second surface mount devices 170 disposed on the second surface 168 of the semiconductor substrate 142. The semiconductor arrangement 140 further includes a plurality of third metallic interconnects 172, each third metallic interconnect 172 disposed between the second surface 168 and each of the plurality of the second surface mount devices 170. The third metallic interconnect 172 may include a stack arrangement like the first 154 and second 158 metallic interconnects. Each of the plurality of the second surface mount devices 170 may be selected from a group consisting of a capacitor, a resistor, an inductor, a ferrite bead, WL-CSP, BGA and a crystal.

FIG. 2B is the side view of the substrate arrangement 140 as seen in the direction of the arrow as shown in FIG. 2A. As can be seen in FIG. 2B, the substrate arrangement 140 includes a third conductive portion 174 positioned to be in contact with the first contact portion 144 via a fourth metallic interconnect 176, the third conductive portion 174 being positioned adjacent to the first conductive portion 152. Like the first conductive portion 152, the third conductive portion 174 is in contact with the first contact portion 144 via the fourth metallic interconnect 176. Further the substrate arrangement 140 may include a fourth conductive portion 178 positioned at or around an interface between the third conductive portion 174 and the first surface mount device 156.

In addition, the substrate arrangement 140 in FIG. 2B may include a further electrical connector 180 configured to connect the further opposing contact portions 182, 184 on the first surface 148 of the semiconductor substrate 142. The further electrical connector 180 is similar to the electrical connector 150 as shown in the front view in FIG. 2A with the additional third 174 and fourth 178 conductive portions and the fourth metallic interconnect 176 as mentioned in the previous paragraph.

Figure 3A:
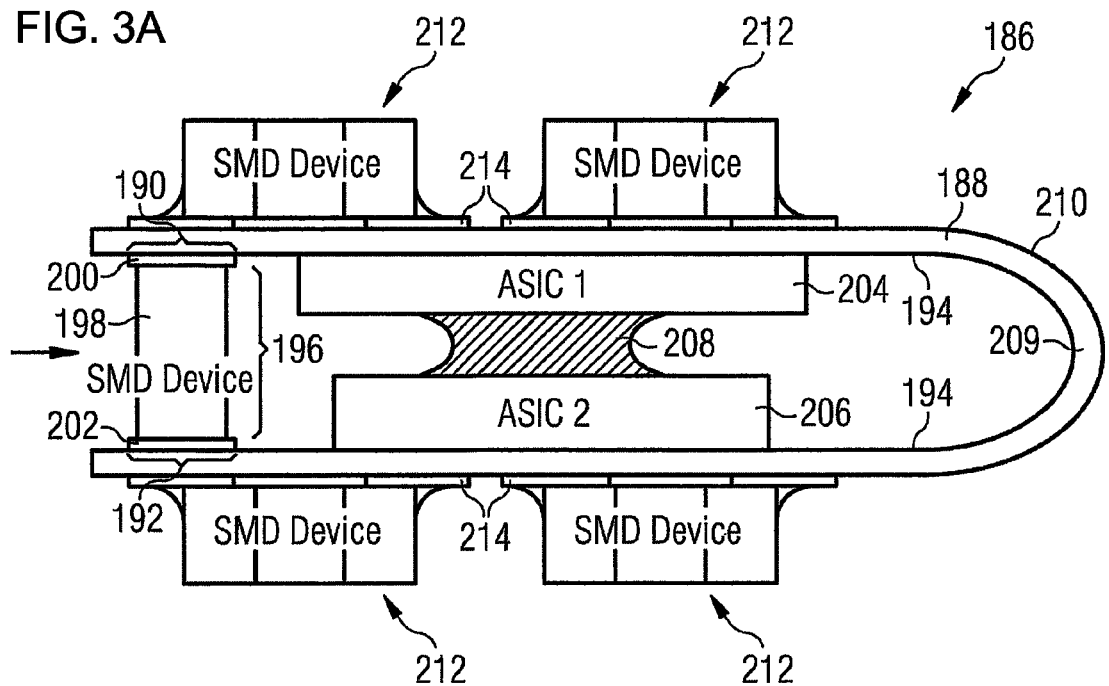
FIGS. 3A and 3B show respective front and side views of a substrate arrangement.
Figure 3B:
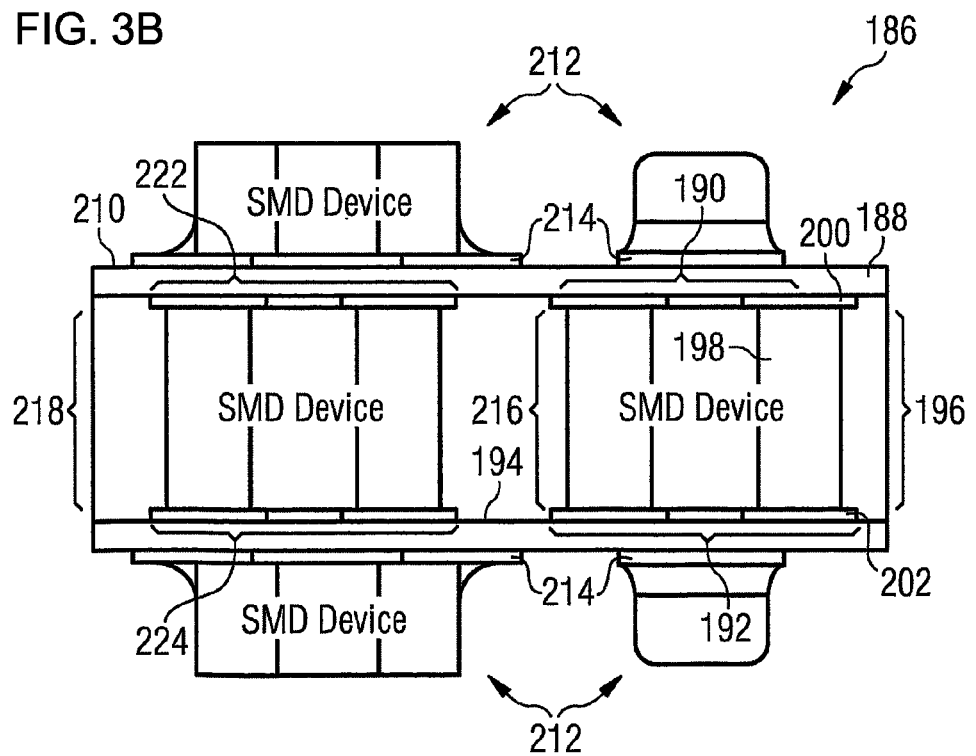

FIG. 3A and FIG. 3B show respective front and side views of a substrate arrangement.

As can be seen in FIG. 3A, the substrate arrangement 186 may include a semiconductor substrate 188 including a first contact portion 190 and a second contact portion 192 on a first surface 194 of the semiconductor substrate 188. The semiconductor substrate 188 is arranged such that the first contact portion 190 and the second contact portion 192 face each other. The substrate arrangement 186 further includes an electrical connector 196 configured to connect the first contact portion 190 and the second contact portion 192 via a respective first metallic interconnect 200 and a second metallic interconnect 202. The electrical connector 196 includes a first surface mount device 198 and the first surface mount device 198 is positioned to be in respective contact with the first contact portion 190 and the second contact portion 192 via respective first metallic interconnect 200 and second metallic interconnect 202.

As mentioned previously, the substrate arrangement 186 may further include the first metallic interconnect 200 disposed between the first contact portion 190 and the electrical connector 196. The first metallic interconnect 200 may include a stack arrangement (not shown), the stack arrangement including a first metallic layer, a second metallic layer disposed above the first metallic layer and a third metallic layer disposed above the second metallic layer. The first metallic layer is in contact with the first contact portion 190 and the third metallic layer is in contact with the electrical connector 196. The first metallic layer may include a copper material, the second metallic layer may include a nickel material and the third metallic layer may include a gold material.

As also mentioned previously, the substrate arrangement 186 may further include the second metallic interconnect 202 disposed between the second contact portion 192 and the electrical connector 196. The second metallic interconnect 202 may include a stack arrangement (not shown), the stack arrangement including a fourth metallic layer, a fifth metallic layer disposed above the fourth metallic layer and a sixth metallic layer disposed above the fifth metallic layer. The fourth metallic layer is in contact with the second contact portion 192 and the sixth metallic layer is in contact with the electrical connector 196. The fourth metallic layer may be of the same material as the first metallic layer and may include a copper material. The fifth metallic layer may be of the same material as the second metallic layer and may include a nickel material. The sixth metallic layer may be of the same material as the third metallic layer and may include a gold material.

The substrate arrangement further 186 includes a first integrated circuit 204 and a second integrated circuit 206 disposed on the first surface 194 of the semiconductor substrate 188. The first integrated circuit 204 and the second integrated circuit 206 may be application-specific integrated circuits. The first integrated circuit 204 may be positioned adjacent to the first surface mount device 198 on the first surface 194 of the semiconductor substrate 188 and the second integrated circuit 206 may also be positioned adjacent to the first surface mount device 198 on the first surface 194 on the semiconductor substrate 188. The first integrated circuit 204 may be electrically connected to the second integrated circuit 206 via at least one copper trace (not shown) on respective portions on the first surface 194 on the semiconductor substrate 188 and the electrical connector 196.

The first integrated circuit 204 and the second integrated circuit 206 are arranged such that the first integrated circuit 204 and the second integrated circuit 206 face each other. The first integrated circuit 204 is coupled to the second integrated circuit 206 via an interconnecting portion 208. The interconnecting portion 208 includes a material selected from the group consisting of an adhesive, a tape, an epoxy material.

The semiconductor substrate 188 further includes at least one conductive trace (not shown) on the first surface 194 of the semiconductor substrate 188. The at least one conductive trace may include a copper material. The first integrated circuit 204 is electrically connected to the second integrated circuit 206 via the at least one conductive trace along the bend 209 of the semiconductor substrate 188.

The semiconductor substrate 188 further includes a second surface 210 positioned opposite to the first surface 194. The substrate arrangement 186 further includes a plurality of second surface mount devices 212 disposed on the second surface 210 of the semiconductor substrate 188. The semiconductor arrangement 186 further includes a plurality of third metallic interconnects 214, each third metallic interconnect 214 disposed between the second surface 210 and each of the plurality of the second surface mount devices 212. The third metallic interconnect 214 may include a stack arrangement like the first 200 and second 202 metallic interconnects. Each of the first 198 and the plurality of the second surface mount devices 212 may be selected from a group consisting of a capacitor, a resistor, an inductor, a ferrite bead, WL-CSP, BGA and a crystal.

FIG. 3B is the side view of the substrate arrangement 186 as seen in the direction of the arrow as shown in FIG. 3A. As can be seen in FIG. 3B, the substrate arrangement 186 further includes a third surface mount device 216 positioned to be in contact with the first contact portion 190 and the second contact portion 192 via the respective first 200 and second 202 metallic interconnects, the third surface mount device 216 being positioned adjacent to the first surface mount device 198.

In addition, the substrate arrangement 186 in FIG. 3B includes a further electrical connector 218 configured to connect the further opposing contact portions 222, 224 on the first surface 194 of the semiconductor substrate 188. The further electrical connector 218 is similar to the electrical connector 196 as shown in the front view in FIG. 3A with the additional third surface mount device 216 as mentioned in the previous paragraph.

Figure 4:
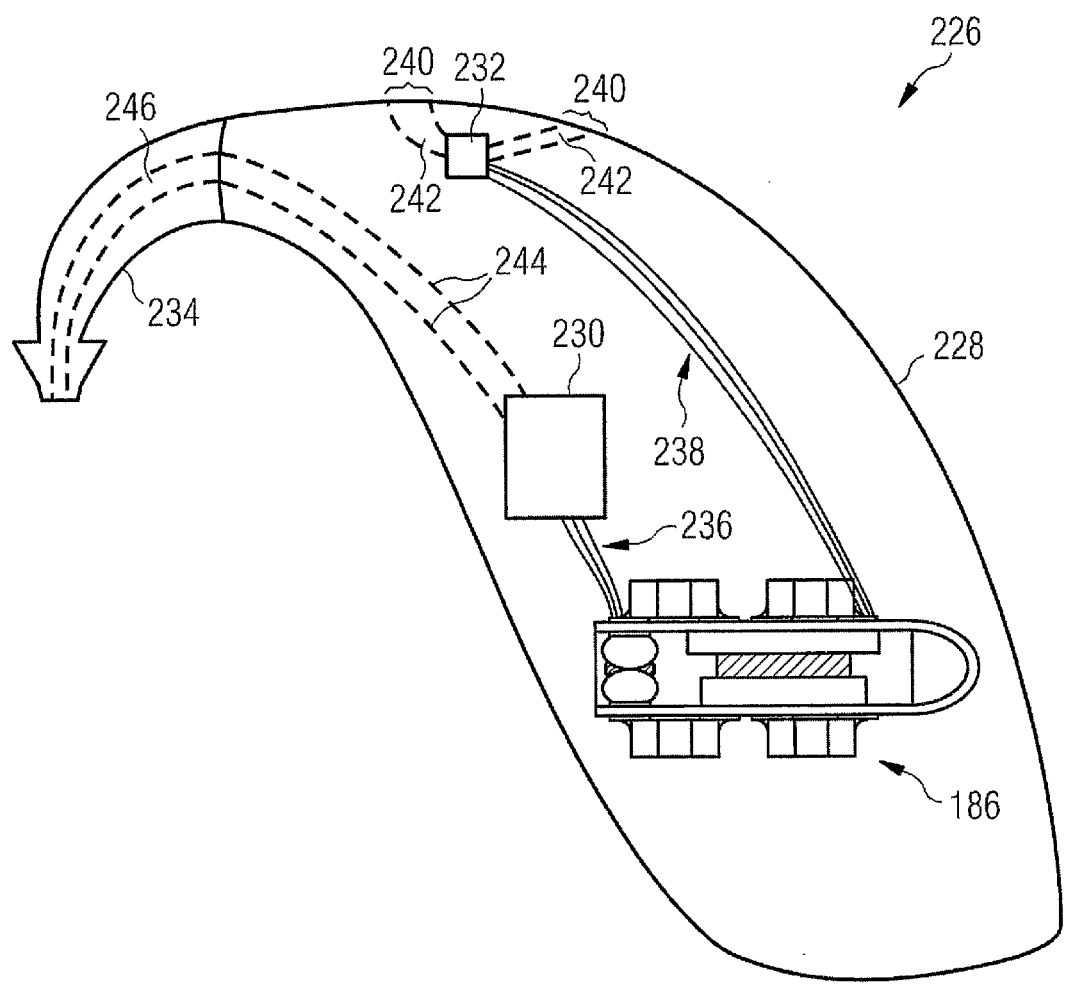
FIG. 4 shows a hearing aid including the substrate arrangement of FIG. 1A.

FIG. 4 shows a hearing aid 226 including the substrate arrangement 186 of FIG. 1A. The hearing aid 226 as shown in FIG. 4 may include a behind-the-ear (BTE) hearing aid. The hearing aid 226 may include a hearing aid housing 228, a receiver or loudspeaker 230, a microphone 232, an ear hook 234 and a substrate arrangement 186 as shown in FIG. 1A.

The ear hook 234 may be coupled with the hearing aid housing 228 and the ear hook 234 may serve to fix the hearing aid 226 behind the ear of the hearing aid user.

The loudspeaker 230, the microphone 232 and the substrate arrangement 186 may be positioned within the hearing aid housing 228.

The loudspeaker 230 may be coupled to the substrate arrangement 186 via one or a plurality of litz wires 236. The loudspeaker 230 may also be coupled to the substrate arrangement 186 via any other suitable connection.

Similarly, the microphone 232 may be coupled to the substrate arrangement 186 via one or a plurality of litz wires 238. The microphone 232 may also be coupled to the substrate arrangement 186 via any other suitable connection.

The microphone 232 may be coupled to two microphone outlets 240 on the hearing aid housing 228 via one or a plurality of microphone connection tubes 242. The microphone connection tubes 242 may include sound tubes, suspension tubes or other suitable connections. The microphone 232 may be coupled to only one or more than two microphone outlets 240 depending on design requirements.

The ear hook 234 may include a hollow portion 246 for channeling sound from the loudspeaker 230 to the user ear. The ear hook 234 may be coupled to the loudspeaker 230 via an ear hook connection 244. The ear hook connection 244 may include a metal connection, a plastic connection, a rubber connection or any other suitable connection.

It is to be noted, that the substrate arrangement 186 in accordance with various embodiments could also be used in any other type of hearing aid such as e.g. a type of hearing aid as mentioned above.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A substrate configuration, comprising:
a semiconductor substrate having a first surface, a first contact portion and a second contact portion on said first surface, said semiconductor substrate disposed such that said first contact portion and said second contact portion face each other; and
an electrical connector connecting said first contact portion and said second contact portion, said electrical connector having a first conductive portion and a second conductive portion, said first conductive portion positioned to be in electrical connection with said second conductive portion.

2. The substrate configuration according to claim 1, wherein said first conductive portion is positioned to be in contact with said first contact portion.

3. The substrate configuration according to claim 2, wherein said second conductive portion is positioned to be in contact with said second contact portion.

4. The substrate configuration according to claim 1, wherein said electrical connector further has a third conductive portion, positioned at or around an interface between said first conductive portion and said second conductive portion.

5. The substrate configuration according to claim 1, wherein at least one of said first conductive portion and said second conductive portion has a material selected from the group consisting of a solder material, a copper material.

6. The substrate configuration according to claim 4, wherein said first conductive portion, said second conductive portion and said third conductive portion are made of a same material.

7. The substrate configuration according to claim 1, further comprising a first metallic interconnect disposed between said first contact portion and said electrical connector.

8. The substrate configuration according to claim 7, wherein said first metallic interconnect has a first metallic layer, a second metallic layer disposed above said first metallic layer; and a third metallic layer disposed above said second metallic layer.

9. The substrate configuration according to claim 8, wherein said first metallic layer is in contact with said first contact portion.

10. The substrate configuration according to claim 8, wherein said third metallic layer is in contact with said electrical connector.

11. The substrate configuration according to claim 8, wherein said first metallic layer includes a copper material.

12. The substrate configuration according to claim 8, wherein said second metallic layer includes a nickel material.

13. The substrate configuration according to claim 8, wherein said third metallic layer includes a gold material.

14. The substrate configuration according to claim 8, further comprising a second metallic interconnect disposed between said second contact portion and said electrical connector.

15. The substrate configuration according to claim 14, wherein said second metallic interconnect has a fourth metallic layer, a fifth metallic layer disposed above said fourth metallic layer; and a sixth metallic layer disposed above said fifth metallic layer.

16. The substrate configuration according to claim 15, wherein said fourth metallic layer is in contact with said second contact portion.

17. The substrate configuration according to claim 15, wherein said sixth metallic layer is in contact with said electrical connector.

18. The substrate configuration according to claim 15, wherein said fourth metallic layer is of a same material as said first metallic layer.

19. The substrate configuration according to claim 15, wherein said fifth metallic layer is of the same material as said second metallic layer.

20. The substrate configuration according to claim 15, wherein said sixth metallic layer is of a same material as said third metallic layer.

21. The substrate configuration according to claim 15, wherein said fourth metallic layer includes a copper material.

22. The substrate configuration according to claim 15, wherein said fifth metallic layer includes a nickel material.

23. The substrate configuration according to claim 15, wherein said sixth metallic layer includes a gold material.

24. The substrate configuration according to claim 1, further comprising a first integrated circuit disposed on said first surface of said semiconductor substrate.

25. The substrate configuration according to claim 24, further comprising a second integrated circuit disposed on said first surface of said semiconductor substrate.

26. The substrate configuration according to claim 24, wherein said first integrated circuit is positioned adjacent to said electrical connector on said first surface of said semiconductor substrate.

27. The substrate configuration according to claim 25, wherein said second integrated circuit is positioned adjacent to said electrical connector on said first surface on said semiconductor substrate.

28. The substrate configuration according to claim 25, wherein said first integrated circuit and said second integrated circuit are disposed such that said first integrated circuit and said second integrated circuit face each other.

29. The substrate configuration according to claim 28, wherein said first integrated circuit is coupled to said second integrated circuit via an interconnecting portion.

30. The substrate configuration according to claim 29, wherein said interconnecting portion is formed of a material selected from the group consisting of an adhesive, a tape and an epoxy material.

31. The substrate configuration according to claim 28, wherein said semiconductor substrate further has at least one conductive trace on said first surface.

32. The substrate configuration according to claim 31, wherein said first integrated circuit is electrically connected to said second integrated circuit via said at least one conductive trace.

33. The substrate configuration according to claim 27, wherein said first integrated circuit is an application-specific integrated circuit.

34. The substrate configuration according to claim 28, wherein said second integrated circuit is an application-specific integrated circuit.

35. The substrate configuration according to claim 1, wherein said semiconductor substrate further has a second surface positioned opposite to said first surface.

36. The substrate configuration according to claim 35, further comprising a third surface mount device disposed on said second surface of said semiconductor substrate.

37. The substrate configuration according to claim 36, further comprising a third metallic interconnect disposed between said second surface and said third surface mount device.

38. The substrate configuration according to claim 35, further comprising a third integrated circuit disposed on said second surface of said semiconductor substrate.

39. The substrate configuration according to claim 36, wherein said third surface mount device is selected from a group consisting of a capacitor, a resistor, an inductor, a ferrite bead, a wafer level chip scale packaging, a ball grid array and a crystal.

40. The substrate configuration according to claim 39, wherein said third integrated circuit is an application-specific integrated circuit.

* * * * *